United States Patent [19]
Burgess et al.

[11] Patent Number: 4,803,450
[45] Date of Patent: Feb. 7, 1989

[54] MULTILAYER CIRCUIT BOARD FABRICATED FROM SILICON

[75] Inventors: James F. Burgess, Schenectady; Homer H. Glascock, II; Harold F. Webster, both of Scotia; Constantine A. Neugebauer, Schenectady; James A. Loughran, Scotia, all of N.Y.

[73] Assignee: General Electric Company, Schenectady, N.Y.

[21] Appl. No.: 134,268

[22] Filed: Dec. 14, 1987

[51] Int. Cl.[4] .................. H01P 3/08; H05K 3/36; B32B 9/06; B23K 31/02

[52] U.S. Cl. ...................... 333/238; 29/830; 228/180.2; 361/414; 428/450; 428/901

[58] Field of Search ............... 333/238, 247; 361/414; 357/68; 29/825, 829, 830; 228/123, 124, 180.2; 174/68.5; 428/448, 450, 901

[56] References Cited

U.S. PATENT DOCUMENTS

| | | | |
|---|---|---|---|
| 3,290,760 | 12/1966 | Cave | 29/830 X |
| 3,323,198 | 6/1967 | Shortes | 357/68 X |
| 3,537,174 | 11/1970 | May | 228/123 X |
| 3,551,997 | 1/1971 | Etter | 228/124 M |
| 3,651,562 | 3/1972 | Hambleton | 228/123 X |
| 3,700,547 | 10/1972 | Satterfield et al. | 428/901 X |
| 3,829,601 | 8/1974 | Jeannotte et al. | 361/414 X |
| 4,541,035 | 9/1985 | Carlson et al. | 361/414 |
| 4,545,610 | 10/1985 | LaKritz et al. | 228/180.2 X |
| 4,595,428 | 6/1986 | Anthony et al. | 148/187 |

OTHER PUBLICATIONS

J. F. McDonald et al., "Multilevel Interconnections for Wafer Scale Integration", *J. Vac. Sci. Technol. A* 4(6), Nov./Dec. 1986, pp. 3127–3138.

H. H. Glascock, II, et al., "Isolated Conducting Vias in Silicon Circuit Boards", *GE Technical Information Series*, Feb. 1986, pp. 1–10.

*Primary Examiner*—Paul Gensler
*Attorney, Agent, or Firm*—Marvin Snyder; James C. Davis, Jr.

[57] ABSTRACT

Multilayer circuit boards composed primarily of silicon and containing buried ground planes and buried conducting runs are fabricated in one embodiment by positioning conductive patterns (12) on the surfaces of silicon substrates and melting a solder component of the conductive patterns (12) and allowing it to flow together with solder from the conductive patterns (12) on a stacked, adjacent silicon substrate (10). When the solder cools, a single conductive pathway (18) exists between adjacent silicon substrates (10) and bonds the adjacent substrates. If the substrates are coated with $SiO_2$ (20), a multilayer structure with buried microwave strip lines (22) is formed in the bonding process. Alternatively, highly resistive silicon substrates (26) are used as a dielectric for microwave strip lines (24) on a top surface thereof and a conductive sheet (28) on the bottom surface thereof acts as a ground plane for microwave energy propagating along strip line (24).

19 Claims, 5 Drawing Sheets

MULTILAYER CIRCUIT BOARD FABRICATED FROM SILICON

BACKGROUND OF THE INVENTION

1. Field of the Invention

The subject invention is directed to fabricating multilayer circuit boards composed primarily of silicon which have high thermal conductance and possess a thermal expansion coefficient near that of silicon devices and, more particularly, to fabricating a multilayer circuit board which contains buried ground planes and conducting runs.

2. Description of the Prior Art

Silicon has been proposed as a circuit board substrate because a silicon substrate will be matched in thermal expansion properties to the silicon chips mounted thereon and exhibits a high thermal conductivity, beneficial in removing heat from the chips mounted thereon. In GE Report 86CRD010, *Isolated Conducting Vias in Silicon Circuit Boards*, (Feb., 1986), H. H. Glascock, II et al. proposed using a silicon sheet as a two sided circuit board. In the silicon sheet, laser drilled through-holes, as demonstrated by T. Anthony Houston and J. Loughran in U.S. Pat. No. 4,595,428, issued June 17, 1986, and assigned to the instant assignee, allow interconnection of the circuitry on either side of the board. In "Multilevel Interconnections For Wafer Scale Integration", *Journal of Vacuum Science and Technology A*, Vol. 4, No. 6, November/December 1986, pp. 3127-3138, J. F. McDonald et al. proposed using silicon as a packing material for semiconductor devices primarily because of matching thermal expansion coefficients. In order to make the silicon plates on either side of the semiconductor device useful as electrical contacts the silicon contact plate was shorted from one side to the other by laser drilled vias which were subsequently filled with metal.

In U.S. Pat. No. 4,541,035, issued Sept. 10, 1985, and assigned to the instant assignee, Carlson et al. disclose a low electrical loss circuit board using a silicon substrate and incorporating multiple levels of patterned conductors. An inner substrate layer of monocrystalline silicon has upper and lower insulative layers disposed on its upper and lower surfaces. A first, inner level of upper and lower patterned conductors is provided on the upper and lower insulative layers, respectively, these layers preferably constituting ground planes for a second, outer level of patterned conductors. Provided on the first level upper and lower patterned conductors are upper and lower layers, respectively, of high resistivity, polycrystalline silicon, over which are provided second level upper and lower patterned conductors, respectively. To provide electrical communication between the first and second level upper conductor patterns, upper conducting feedthroughs are provided which extend through the upper polycrystalline silicon layer. To provide electrical communication between the first and second level lower patterned conductors, lower conducting feedthroughs are provided which extend through the lower polycrystalline silicon layer. The printed circuit board may incorporate still further levels of patterned conductors by iteratively providing additional polycrystalline silicon layers and additional levels of patterned conductors arranged in the foregoing sequence.

McDonald et al. do not discuss the possibility of fabricating a multilayer silicon circuit board with conductive patterns within the circuit board. The proposed silicon board only has circuitry on its upper and lower surfaces. For some applications it is desirable to have multilayer circuit boards containing ground planes and conducting runs within the circuit board. Carlson et al show a multilevel silicon circuit board with inner conductors which are used as ground planes. This device is designed for high frequency applications and is expensive to manufacture. In fabricating the multilayer circuit board a plurality of processing steps are required. First, insulative layers must be formed on a substrate layer. Second, patterned conductors used as a ground plane are formed on the insulative layer. Third, polycrystalline silicon layers are formed on the ground plane. Fourth, patterned conductors are formed on the polycrystalline layer and conducting feedthroughs are created in the polycrystalline layer. If a multilayer circuit board with internal conductive patterns is to be created, the process must be repeated to form another conducting pattern layer and another ground plane layer.

SUMMARY OF THE INVENTION

It is therefore an object of this invention to provide a multilayer circuit board composed primarily of silicon with internal conductive patterns or ground planes, which is easier and less expensive to fabricate.

It is another object of this invention to provide a multilayer silicon circuit board with internal conductive patterns created by stacking a plurality of silicon substrates that include mirror image conductive patterns on their surfaces and then using the powerful capillary forces of liquid solder to align the patterns on the substrates, thereby forming a single conductive pattern between any two stacked silicon substrates.

It is yet another object of this invention to provide a multilevel silicon structure composed of a plurality of silicon substrates with microwave strip lines formed on dielectric layers on the surface of the silicon substrates, wherein the silicon boards act as the ground plane for the strip lines.

It is another object of this invention to provide a multilevel silicon structure composed of a plurality of high resistivity silicon substrates with microwave strip lines formed on a top surface of a silicon board and a ground plane on a bottom surface of the silicon substrate.

It is yet another object of this invention to provide a multilevel silicon circuit board composed of alternating layers of silicon and thin refractory metal sheets wherein the sheets are bonded to the silicon by an aluminum or aluminum-silicon-magnesium alloy braze.

It is another object of this invention to provide a multilevel silicon circuit board that is fabricated using direct bonded copper technology so as to eliminate the need for solder and adhesives to bond the layers of silicon together.

According to a first embodiment of the invention, a plurality of silicon substrates, being boards or wafers, with conductive patterns thereon, are stacked and roughly aligned but not bonded. Conductive patterns on the inner surfaces of adjacent, stacked silicon substrates are provided as mirror images. The conductive patterns comprise high melting point solders on wettable conductors. When the assembly is heated, the solder layers on these conductors flow together and merge to form a single conductor between the adjacent silicon substrates. Strong capillary forces in the solder tend to cause the adjacent silicon substrates to self-register. The solder is then allowed to cool, thereby permanently joining the silicon substrates in a multilayer form. The multilayer circuit board created by this process includes conductive runs on each outer surface of the board as well as conductive runs buried within the board. The idea of self-registering silicon substrates is an extension of flip chip technology whereby solder balls on the terminals of a semiconductor chip yield capillary forces which serve to align a chip atop conductive runs on a printed circuit board. Conductive vias formed before assembly of the multilayer circuit board provide interconnections between conductive patterns on opposite surfaces of each silicon substrate. The conductive vias may be formed by laser drilling the silicon substrate followed by filling the resulting holes with conductive paste, or by ablative laser deposition.

A variation on the above described self registration process for forming a multilayer silicon circuit board comprises the formation of a multilayer silicon structure including microwave strip lines. In one aspect of this variation, the surfaces of heavily doped silicon substrates are oxidized to form a thin $SiO_2$ (silicon dioxide) layer thereon. Conductive patterns are then formed atop the $SiO_2$ layer. A plurality of these silicon substrates are then stacked and joined using the capillary forces of molten solder to self register the substrates as described above. A simple microwave strip line is formed with the conductor being the conductive pattern, the $SiO_2$ layer being the dielectric, and the silicon substrate being the ground plane. In another aspect of this variation, high resistivity silicon is used as the dielectric between a conductive run formed on one surface of the high resistivity silicon and a conductive film formed on the opposite surface, the conductive film serving as a ground plane. A multilayer structure can be formed by stacking a plurality of the high resistivity silicon substrates with conductive runs formed on one side and conductive films formed on the other side and heating them to effectuate a solder joining of conductors on adjacent stacked substrates.

According to a second embodiment of the invention, a plurality of silicon substrates are joined together to form a silicon circuit board with buried ground planes comprised of a refractory metal such as molybdenum or tungsten. The thermal expansion coefficients of molybdenum and tungsten are relatively good matches to that of silicon and therefore sheets made of these elements are preferred. A refractory metal sheet inserted between adjacent silicon substrates is bonded to the silicon substrates by a brazing compound, such as an aluminum or aluminum-silicon-magnesium alloy braze. Other brazing materials or solders may be used for different applications. The thickness of the refractory metal sheets ranges from as thin as 0.002 centimeters (cm) to as thick as 1 cm. Thin sheets are preferred, and they generally provide a ground plane for conductive patterns formed on opposite surfaces of a silicon substrate. Thick sheets may be desired for heat sinking purposes. Holes may be cut into the refractory metal sheet before assembly of the multilayer circuit board structure at positions that are coaxial with laser holes previously drilled in the silicon layers or where the holes will be drilled after assembly. Shorting of through-hole conductors to the refractory metal layers is avoided by recessing the hole cut into the refractory metal sheet relative to the laser hole drilled in the silicon substrate. If desired, refractory metal strips rather than a refractory metal sheet may be bonded between adjacent silicon substrates.

In a third embodiment of the invention, direct bonded copper technology is used to join a plurality of silicon substrates to form a multilayer silicon circuit board. The silicon substrates are coated with a thin layer of $SiO_2$ which is less than 10,000 Angstroms thick. The layer may be thermally grown or may be deposited by chemical vapor deposition (CVD). Thin copper sheets which are approximately 0.012 cm thick are coated with copper oxide by exposing the sheets to an 80° C. oxidizing solution. The silicon substrates having thin $SiO_2$ layers are stacked alternately with the oxide-coated copper sheets. A stacked structure is then sent through a belt furnace at approximately 1072° C. in a nitrogen atmosphere, so as to form a high thermal conductance bond. The bond is isolated from the silicon substrates by the $SiO_2$ layers which prevent the interaction of silicon and copper at elevated temperatures. The resulting structure constitutes a silicon circuit board with buried ground planes. A variation of this embodiment includes photo-etching or stamping the copper sheet before direct bonding. The resulting copper patterns comprise electrical pathways located on the surfaces and buried within the resulting multilayer circuit board after the direct bonding copper operation. Semiconductor chips may then be soldered or glued on top of a copper run on the surface of the multilayer circuit board. In addition, the copper pattern bonded to the outer surfaces of the multilayer circuit board may include mounting pads on which the semiconductor chips will be glued, the copper mounting pad thus serving as a heat spreader for heat generated by the chip.

BRIEF DESCRIPTION OF THE DRAWINGS

The foregoing and other objects, aspects and advantages of the invention will be better understood from the following detailed description of the invention with reference to the drawings, in which.

DETAILED DESCRIPTION OF THE PREFERRED EMBODIMENTS OF THE INVENTION

Figure 1:
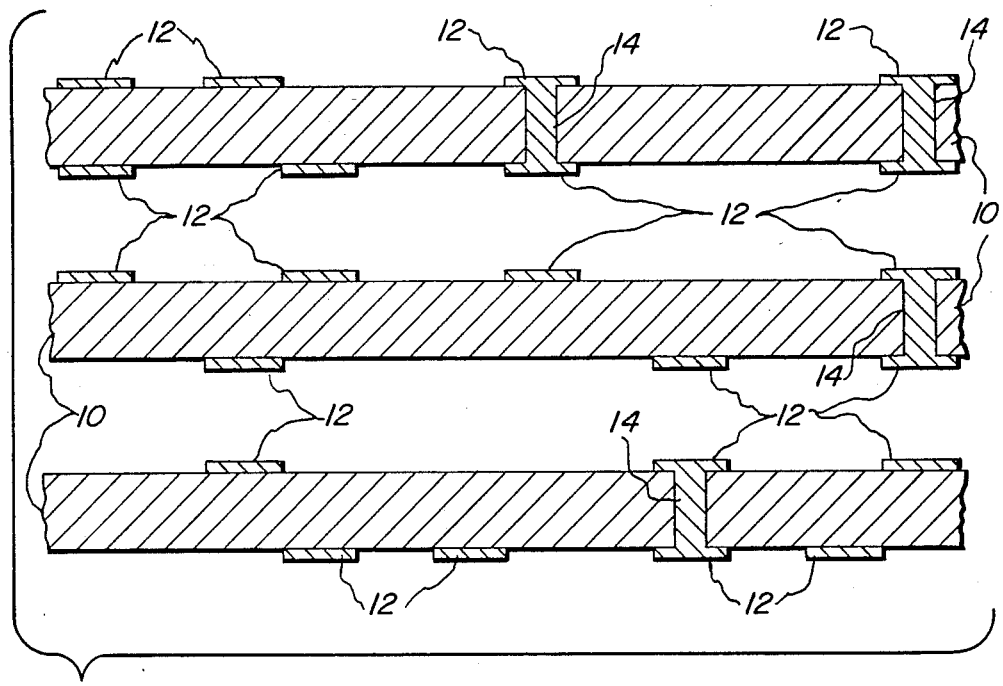
FIG. 1 is a cross-sectional side view of three silicon substrates having conductive patterns thereon and conductive vias therethrough, showing the mirror image relationship of conductors on adjacent substrates.

In a first embodiment of the invention, plural silicon substrates with conductive patterns on their surfaces are joined to form a multilevel silicon structure with buried conductive patterns. As shown in FIG. 1, a plurality of silicon substrates 10 have conductive patterns 12 on both the top and bottom surfaces and have conductive vias 14 therethrough. The conductive patterns 12 may be deposited on the silicon substrates 10 by well known deposition techniques or they may be attached to the silicon substrates by well known gluing techniques. The conductive vias 14 may be formed by laser drilling and subsequent conductive paste filling operations, or by ablative laser deposition methods. The conductive patterns 12 on the bottom surface of a first silicon substrate 10 form a mirror image of the conductive patterns 12 on the top surface of the silicon substrate 10 positioned directly below the first silicon substrate 10. The conductive patterns 12 are comprised of high melting point solders on wettable conductors. The silicon substrates 10 are stacked such that conductive patterns 12 on stacked adjacent silicon substrates 10 are roughly in alignment.

Figure 2:
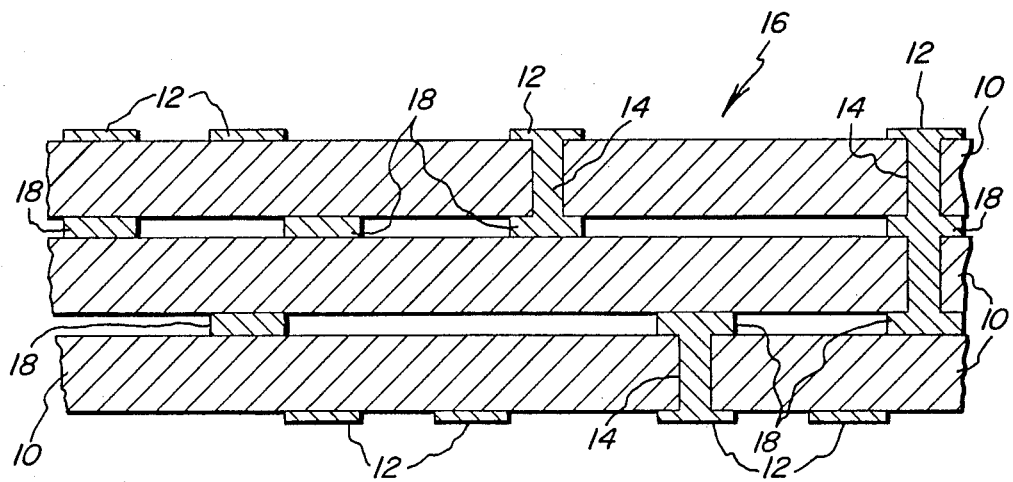
FIG. 2 is a cross-sectional side view of a multilayer circuit board showing single, buried conductive paths formed between stacked adjacent silicon substrates.

The stacked structure is then heated to a high enough temperature to melt the solder in conductive patterns 12. The liquid solder from conductive patterns 12 on adjacent silicon substrates 10 flows together, forming a single buried conductor between the adjacent silicon substrates. FIG. 2 shows a multilayer silicon circuit board 16 with a number of buried conductors 18 formed from liquid solder on conductive patterns 12 on adjacent silicon substrates flowing together. The solder is then cooled so that the buried conductors 18 serve to bond adjacent silicon substrates 10. The silicon substrates 10 tend to be self-registering because of strong capillary forces provided by the liquid solder during the heating cycle. The final structure has conductor runs on each outer surface as well as buried layers 18 within the multilayer silicon circuit board 16. The conductive vias 14 permit electrical interconnection of the several levels of conductive patterns 12 on the multilayer silicon circuit board 16.

Figure 3:
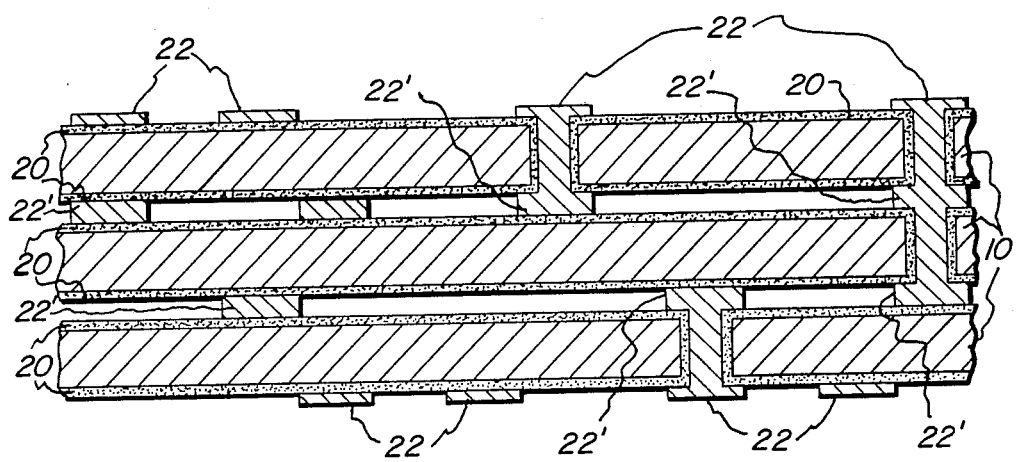
FIG. 3 is a cross-sectional side view of a multilayer silicon structure showing microwave strip lines formed on $SiO_2$ layers with individual silicon substrates acting as ground planes.

FIG. 3 illustrates a variation on the above described concept. Before the conductor runs are deposited, silicon substrate 10 is oxidized to form a thin $SiO_2$ layer 20. A multilayer silicon structure is then formed as described above wherein liquid solder from adjacent conductive patterns has the effect of self-registering the silicon substrates 10 to form a multilayer silicon structure. In this arrangement, the conductive patterns act as a complex of microwave strip lines 22 on the top and bottom surfaces of the multiplayer circuit board and strip lines 22' on the inner surfaces thereof, with the $SiO_2$ layer 20 being the dielectric for the strip lines and the silicon substrates 10 being heavily doped to act as ground planes.

Figure 4:
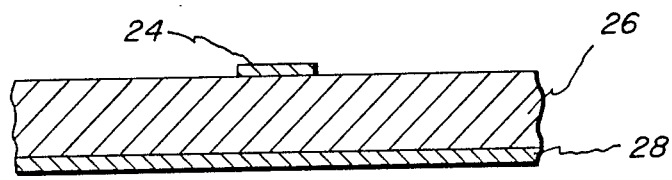
FIG. 4 is a cross-sectional side view of a microwave strip line in which a high resistivity silicon substrate acts as a dielectric.

One advantage of using a con substrate is that its conductivity is controllable by use of doping techniques. Silicon may be doped to act as a conductor for as a ground plane as described above or it may be doped to act as an insulator. FIG. 4 shows a microwave strip line 24 formed on the top surface of a high resistivity silicon substrate 26 with a conductive sheet 28 formed on the bottom surface of the silicon substrate acting as a ground plane. In this arrangement, the high resistivity silicon substrate 26 is an insulator and it provides the dielectric for the microwave strip line 24. In the preferred embodiment, the microwave strip line 24 and the conductive sheet 28 comprise high melting solders on wettable conductors.

Figure 5:
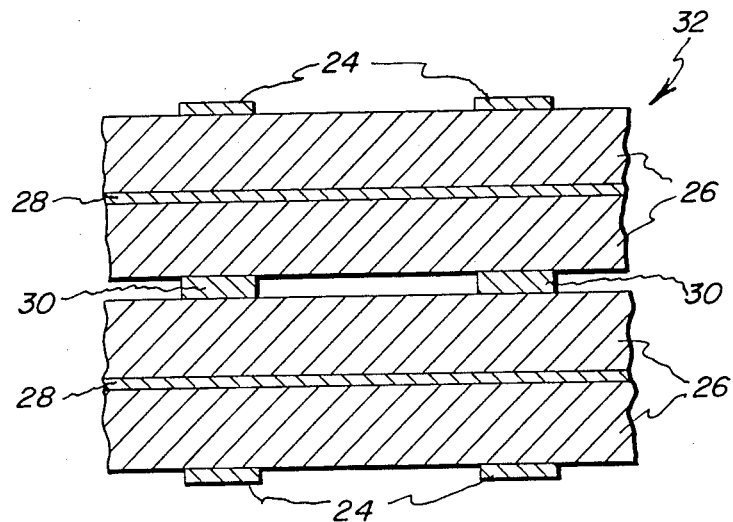
FIG. 5 is a cross-sectional side view of a multilayer silicon structure showing a plurality of microwave strip lines formed both on its surfaces and buried within the structure.

FIG. 5 shows a multilayer silicon structure 32 formed by stacking a plurality of microwave strip line devices such that the conductive sheet ground planes 28 of to stacked microwave strip line devices are adjacent and such that mirror image microwave strip lines 24 of two adjacent microwave strip line devices are adjacent, and then heating the stacked structure such that the solder component of adjacent conductive sheets and adjacent microwave strip lines flows together. Cooling the solder yields a multilayer silicon structure 32 with a complex of buried microwave strip lines 30, buried conductive sheets 28 acting as ground planes, and a complex of microwave strip lines 24 on its top and bottom surfaces.

Figure 6:
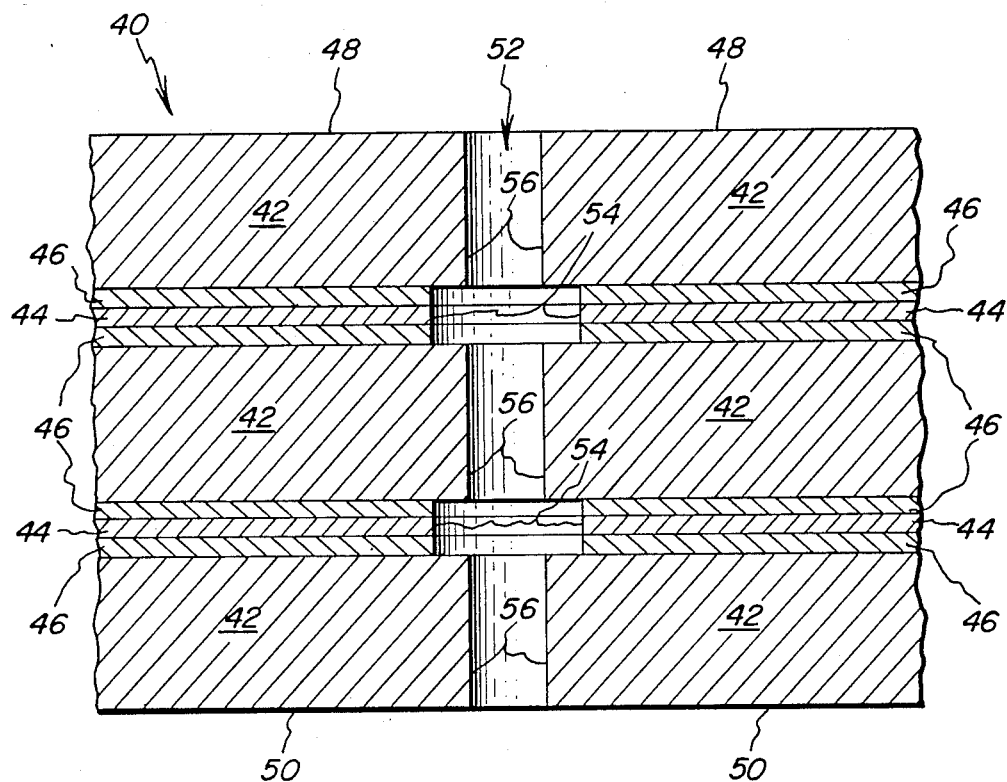
FIG. 6 is a cross-sectional side view of a multilayer circuit board comprised of alternating layers of silicon substrates and refractory metal sheets which act as buried ground planes, and showing an alloy braze used to join the silicon substrates to the refractory metal sheets.

In a second embodiment of the invention, a multilayer silicon circuit board containing buried layers of refractory metal is created. FIG. 6 is a cross-sectional side view of a multilayer circuit board 40 comprised of alternately stacked silicon substrates 42 and refractory metal sheets 44. The refractory metal sheet 44 may comprise molybdenum of tungsten, which have thermal coefficients of or tungsten, which have thermal coefficient of expansion that match the thermal coefficient of expansion of silicon. The refractory metal sheet 44 ranges in thickness from as thin as 0.002 cm to as thick as 1 cm. A thin refractory metal sheet 44 is generally used as a ground plane for conductor runs which would be placed on the surface of the multilayer circuit board 40. A thick refractory metal sheet 44 is generally used for heat sinking purposes The silicon substrates 42 and the refractory metal sheets 44 are joined together with a brazing compound 46. Preferably the brazing compound 46 is an aluminum or aluminum-silicon-magnesium alloy, but other materials may be chosen for different applications. Electrical communication between the top surface 48 and bottom surface 50 of the multilayer silicon circuit board 40 is provided by through-holes 52. Openings 54 are cut into the refractory metal sheet 44 coaxial with laser holes 56 previously drilled in the silicon substrates 42 or where laser holes 56 will be drilled after assembly of the multilayer silicon circuit board 40. The openings 54 are larger in diameter than the laser holes 56, thereby assuring that the edges of the refractory metal sheets 44 are recessed from the laser hole diameter. Hence, shorting between a through-hole conductor and a refractory metal sheet 44 is avoided. If desired, refractory metal strips or other configurations may be substituted for the continuous refractory metal layers.

Figure 7:
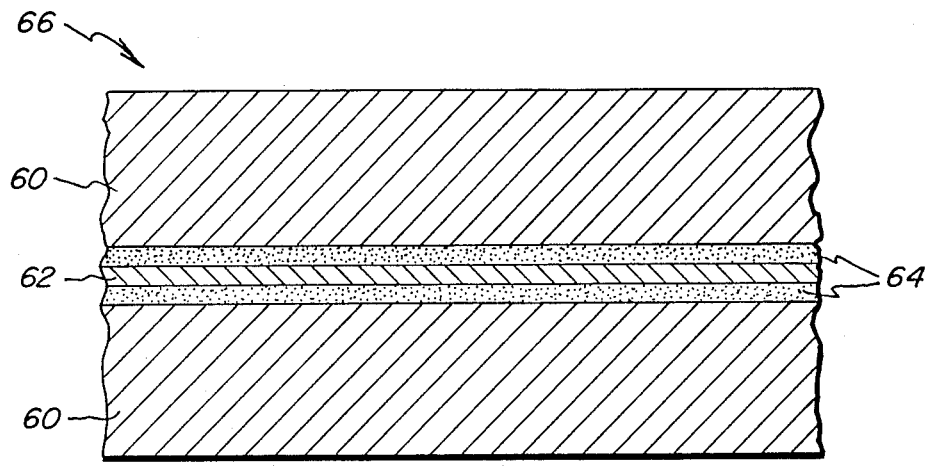
FIG. 7 is a cross-sectional side view of a multilayer silicon structure showing a copper sheet bonded directly to a silicon substrate.

In a third embodiment of the invention, direct bonded copper technology is utilized to create a multilayer circuit board with buried conductor runs or buried ground planes. In this embodiment, copper is bonded directly to silicon without use of an adhesive or solder. FIG. 7 is a cross-sectional side view of two silicon substrates 60 bonded to a copper sheet 62. The silicon substrates 60 are first with a thin layer 64 of thermal or CVD (chemical vapor deposited) SiO₂. The layer 64 is less than approximately 10,000 Angstroms thick and this thickness is sufficient to electrically isolate the silicon substrate 60 from the copper sheet 62. The copper sheet 62 is approximately 0.012 cm thick and is coated with copper oxide by exposure to an 80° C. oxidizing solution. The copper sheet 62 is stacked together with the silicon substrates 60, and with SiO₂ layer 64 next to the copper sheet 62, and the stack is passed through a belt furnace at approximately 1072° C. in a nitrogen atmosphere. The heating step forms a bond having high thermal conductance between the copper sheet 62 and the silicon substrates 60. The SiO₂ layer 64 prevents any chemical interaction of silicon and copper at elevated temperatures.

Figure 8:
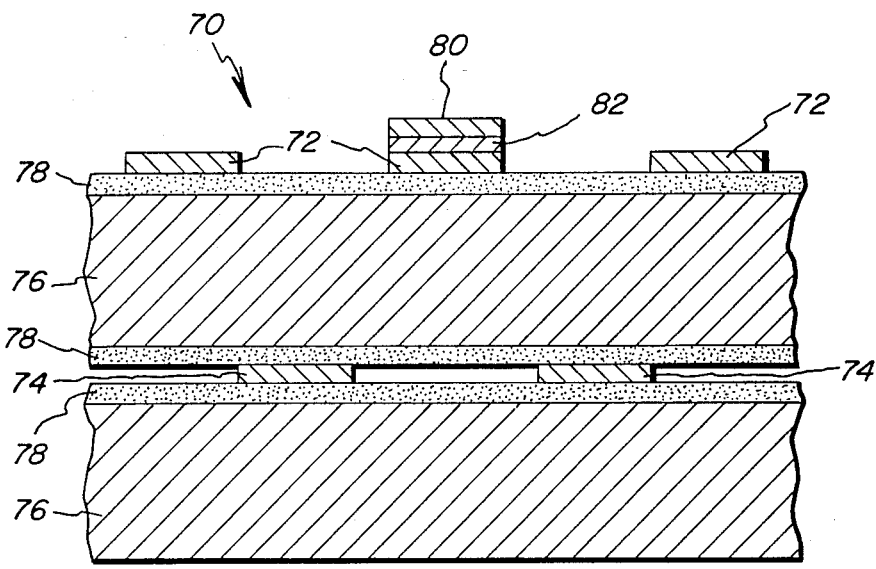
FIG. 8 is a cross-sectional side view of a multilayer silicon circuit board showing buried copper conductive patterns and a semiconductor chip mounted on top of a direct bonded copper formation on the surface of the board.

In a variation of this third embodiment, the copper sheet is patterned using conventional photo-etching or stamping techniques. FIG. 8 shows a multilayer printed circuit board 70 with surface conductor runs 72 and buried conductor runs 74 created using direct bonded copper technology. The surfaces of silicon substrates 76 are coated with a thin layer of thermal or CVD SiO₂ 78. A copper sheet having a surface layer of copper oxide is next placed of the silicon substrates, and surface conductor runs 72 and the buried conductor runs 74 are created by patterning the copper sheet using stamping or photo-etching technologies. A stack consisting of silicon substrates 76 with SiO₂ layers 78 and copper patterns thereon is passed through a belt furnace at approximately 1072° C. in a nitrogen atmosphere. The heat bonds the copper patterns to the silicon substrates 76, thereby forming a multilayer silicon circuit board 70. After the multilayer silicon circuit board 70 cools, a semiconductor integrated circuit chip 80 may be fixedly mounted on a surface conductor 72 using a joining compound 82 such as solder or epoxy.

Figure 9:
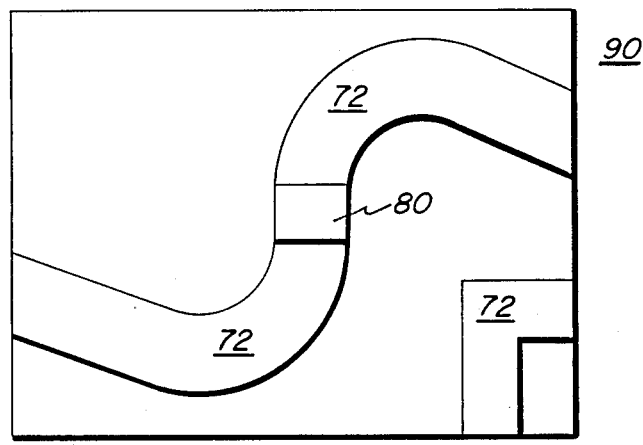
FIG. 9 is a top view of a semiconductor chip mounted on top of a conductive copper pattern direct bonded to the surface of a silicon circuit board.
Figure 10:
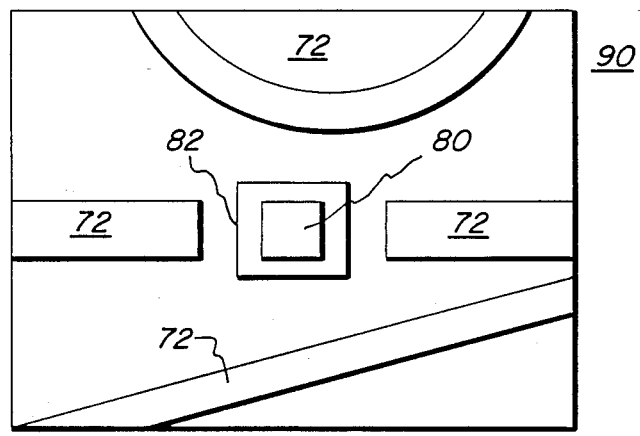
FIG. 10 is a top view of a semiconductor chip mounted on top of a conductive copper heat spreader formation direct bonded to the surface of a silicon circuit board.

FIGS. 9 and 10 are top views of a silicon circuit board 90 with a semiconductor integrated circuit chip 80 mounted on a copper, direct bonded, surface conductor 72 as described above. FIG. 9 shows that the surface conductor on which chip 80 is mounted may be a circuit pathway utilized for carrying current to active devices. Alternatively, FIG. 10 shows that the surface conductor 82 on which chip 80 is mounted may, instead of carry current, be used as a heat spreader for the chip 80.

While the invention has been described in terms of several preferred embodiments, those skilled in the art will recognize that the materials, components and methods of fabricating of the multilayer silicon circuit boards according to the invention may be varied within the spirit and scope of the appended claims.

Having thus described my invention, what we claim as new and desire to secure by Letters Patent is set forth in the following claims:

1. A multilayer silicon circuit board structure, comprising:
   a plurality of silicon substrates, each of said silicon substrates having a first conductive pattern formed on a top surface and a second conductive pattern formed on a bottom surface of said substrate, each of said conductive patterns-comprising a high melting point holder on a wettable conductor;
   conductive vias formed in each of said silicon substrates so as to electrically connect, in said each of said silicon substrates, said first conductive pattern with said second conductive pattern, said first and second conductive patterns on adjacent silicon substrates, respectively, being mirror images of each other;
   said plurality of silicon substrates being arranged in a stack; and
   said high melting point solder of said first and second conductive patterns on adjacent silicon substrates, respectively, being merged with one another to form a bond.

2. A multilayer silicon circuit board structure as recited in claim 1 wherein each of said plurality of silicon substrates comprises a layer of silicon dioxide electrically isolating an inner core of doped silicon, said-doped silicon being highly conductive, said inner core of silicon acting as a ground plane in the presence of microwaves propagating along said first and second conductive patterns.

3. A method of making a multilayer silicon circuit board structure, comprising the steps of:
   creating conductive vias in each of a plurality of silicon substrates, said conductive vias in each of said substrates extending from a top surface of said each of said silicon substrates to a bottom surface of each of said silicon substrates;
   providing conductive patterns on a top surface and a bottom surface of said each of said silicon substrates, said conductive patterns on said each of said substrates being electrically interconnected by said conductive vias, said conductive patterns being comprised of a high tilting point solder on a wettable conductor;
   stacking said plurality of silicon substrates such that conductive patterns on adjacent silicon substrates are roughly in alignment;
   heating the stacked silicon substrates such that said high melting point solder of said conductive patterns on adjacent silicon substrates melts and flows together and self-registers said adjacent silicon substrates; and
   cooling said stacked silicon substrates such that said high melting point solder of said conductive patterns on adjacent silicon substrates bonds said adjacent silicon substrates to one another and forms a single conductive pathway between said adjacent silicon substrates.

4. A method of making a multilayer silicon circuit board structure as recited in claim 3 including, before said step of creating conductive vias:
   doping each of said plurality of silicon substrates such that each of said plurality of substrates becomes highly conductive; and
   providing a layer of silicon dioxide on each major surface of each of said silicon substrates, respectively, so as to electrically isolate said each of said silicon substrates.

5. A multilayer silicon circuit board structure containing a complex of microwave strip lines, comprising:
   a plurality of highly resistive silicon substrates, each of said substrates having a conductive pattern formed on a top surface thereof, respectively, each said conductive pattern acting as a guide for microwave energy;
   a conductive sheet formed on a bottom surface of each of said substrates, respectively, each said conductive sheet serving as a ground plane for microwave energy propagating along said guide, respectively, each said substrate serving as a dielectric between said guide on the top surface thereof and said ground plane on the bottom surface thereof;

said conductive pattern and said conductive sheet on each of said substrates, respectively, comprising a high melting point solder on a wettable conductor, said plurality of substrates being arranged in a stack such that a conductive pattern on a first substrate is adjacent to a conductive pattern on a second substrate and a conductive sheet on said first substrate is adjacent to a conductive sheet on a third substrate; and said high melting point solder of said conductive pattern on said first substrate being merged with said high melting point solder of said conductive pattern on said second substrate to form a first bond, and said high melting point solder of said conductive sheet on said first substrate being merged with said high melting point solder of said conductive pattern on said third substrate to form a second bond.

6. A method of making a multilayer silicon circuit board structure containing a plurality of microwave strip lines, comprising the steps of:

providing a conductive pattern on a top surface of each of a plurality of highly resistive silicon substrates;

providing a conductive sheet on a bottom surface of each of said plurality of substrates;

said conductive pattern and said conductive sheet on each of said substrates, respectively, comprising a high melting point solder;

stacking said substrates such that the conductive sheets on a first pair of adjacent substrates are in contact and such that the conductive patterns on a second pair of adjacent substrates are in contact, said conductive patterns being roughly in alignment;

heating the stacked substrates such that said high melting point solder of said conductive sheets on said first pair of adjacent substrates melts and flows together, said high melting point solder of said conductive patterns on said second pair of adjacent substrates simultaneously melting and flowing together, the melted solder between the substrates of said second pair of adjacent substrates serving to self-register the substrates of said second pair; and cooling said stacked substrates such that said high melting point solder of said conductive sheets on said first pair of adjacent substrates bonds said first pair of adjacent substrates to one another and forms a single conductive pathway therebetween, and such that said high melting point solder of said conductive patterns on said second pair of adjacent substrates bonds said second pair of adjacent substrates to one another.

7. A multilayer silicon circuit board, comprising:

a plurality of silicon substrates arranged in a stack, said stack arrangement having a top silicon substrate and a bottom silicon substrate;

a refractory metal layer positioned between a pair of adjacent silicon substrates in said stack, said refractory metal layer being joined to each silicon substrate of said pair of adjacent silicon substrates in said stack by a brazing compound; and said stack having a through-hole therein extending from a top surface of said top silicon substrate to a bottom surface of said bottom silicon substrate, said through-hole being of larger diameter in said refractory metal layer than in said plurality of silicon substrates, the larger diameter portion of said through-hole recessing said refractory metal layer from said through-hole in said plurality of silicon substrates so as to prevent electrical shorting between an electrical conductor placed in said through-hole and said refractory metal layer.

8. A multilayer silicon circuit board as recited in claim 7 wherein said refractory metal layer comprises a plurality of strips of said refractory metal.

9. A multilayer silicon circuit board as recited in claim 7 wherein said refractory metal comprises one of the group consisting of molybdenum and tungsten.

10. A multilayer silicon circuit board as recited in claim 8 wherein said refractory metal comprises one of the group consisting of molybdenum and tungsten.

11. A multilayer silicon circuit board as recited in claim 7 wherein said brazing compound comprises one of the group consisting of aluminum and an aluminum alloy.

12. A multilayer silicon circuit board as recited in claim 8 wherein said brazing compound comprises one of the group consisting of aluminum and an aluminum alloy.

13. A multilayer silicon circuit board as recited in claim 7 wherein said refractory metal layer is between 0.002 cm and 1 cm in thickness, said refractory metal layer serving as a buried ground plane in said multilayer silicon circuit board.

14. A method of making a multilayer silicon circuit board comprising the steps of:

arranging in a stack a plurality of silicon substrates and refractory metal layers such that a refractory metal layer is positioned between each pair of adjacent silicon substrates in said stack;

brazing each said refractory metal layer, respectively, to each pair of adjacent silicon substrates, respectively, with a brazing compound;

cutting an opening in each of said refractory metal layers; and aligning said opening in each of said refractory metal layers coaxially with a through-hole position in each silicon substrate adjacent each of said refractory metal layers, said opening being of larger diameter than any through-hole coaxially aligned with said position.

15. A multilayer silicon circuit board, comprising:

a plurality of silicon substrates, each of said substrates having a thin surface coating of silicon dioxide, said substrates being arranged in a stack, said stack having a top substrate and a bottom substrate; and an intermediate copper layer positioned, respectively, between each pair of adjacent substrates in said stack, respectively, each said copper layer having a surface coating of copper oxide and being direct bonded to the substrates adjacent thereto.

16. A multilayer silicon circuit board as recited in claim 15, further comprising:

a surface copper layer positioned on a top surface of said top silicon substrate in said stack, said surface copper layer being direct bonded to said top surface and having a surface coating of copper oxide; and semiconductor integrated circuit chips fixedly mounted on said surface copper layer.

17. A multilayer silicon circuit board as recited in claim 16 wherein said intermediate copper layers and said surface copper layer are patterned.

18. A method of making a multilayer silicon circuit board, comprising the steps of:

forming a surface coating of silicon dioxide on each of a plurality of silicon substrates, respectively;

arranging said substrates in a stack, each of said substrates being separated, respectively from each substrate adjacent thereto by an intermediate copper sheet, respectively, each said sheet having an oxidized surface; and direct bonding said intermediate copper sheets to each of the substrates adjacent thereto, respectively.

19. A method of manufacturing a multilayer silicon circuit board as recited in claim 18 including, before performing direct bonding:

placing a surface copper sheet having an oxidized surface on a top surface of the uppermost silicon substrate in said stack; and patterning said surface copper sheet and said intermediate copper sheets.

* * * * *